US 6,639,490 B2

(12) United States Patent
Chominski

(10) Patent No.: US 6,639,490 B2
(45) Date of Patent: Oct. 28, 2003

(54) NINETY DEGREE COUPLER FOR RADIO FREQUENCY DEGRADED CIRCUITS

(75) Inventor: Paul P. Chominski, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/002,430

(22) Filed: Oct. 31, 2001

(65) Prior Publication Data

US 2003/0080827 A1 May 1, 2003

(51) Int. Cl.[7] ............................... H01P 5/19; H01P 5/12
(52) U.S. Cl. ........................................ 333/119; 333/109
(58) Field of Search .............................. 333/119, 109, 333/26, 114, 170, 172, 177

(56) References Cited

U.S. PATENT DOCUMENTS

| 4,375,054 A | * | 2/1983 | Pavio | 333/116 |
| 4,723,307 A | | 2/1988 | Clark et al. | 455/103 |
| 4,777,458 A | | 10/1988 | Pardini | 333/112 |
| 5,128,638 A | | 7/1992 | Staudinger et al. | 333/109 |
| 5,304,961 A | | 4/1994 | Dydyk | 333/112 |
| 5,748,056 A | | 5/1998 | Bahl | 333/112 |
| 5,886,589 A | * | 3/1999 | Mourant | 333/26 |
| 6,380,821 B1 | * | 4/2002 | Imbornone et al. | 333/25 |

* cited by examiner

Primary Examiner—Robert Pascal
Assistant Examiner—Dean Takaoka
(74) Attorney, Agent, or Firm—Blakely, Sokoloff, Taylor & Zafman LLP

(57) ABSTRACT

The present invention provides a ninety degree coupler for a frequency range of 100 mHz to gigaHertz ranges and including a minimum number of components employing a four port device which receives an input signal and splits it between a transformer coil and another reactor and couples it to another port and splits it between the transformer and a capacitor, then cross-connecting to a capacitor where phase shift is created by the inductors and capacitors resulting in phase shift between the signal ports remaining at 90 degrees over a wide frequency band.

4 Claims, 7 Drawing Sheets

| FREQ-MHZ | DB[S11] | DB[S22] | DB[S21] | DB[S31] | DB[S23] | ANG[S21] | ANG[S31] |
|---|---|---|---|---|---|---|---|
| 10.0000 | -35.455 | -35.455 | -25.823 | -0.014 | -34.986 | 86.676 | -2.986 |
| 20.0000 | -29.573 | -29.573 | -19.831 | -0.056 | -29.104 | 83.382 | -5.960 |
| 30.0000 | -26.285 | -26.285 | -16.355 | -0.124 | -25.815 | 80.139 | -8.912 |
| 40.0000 | -24.117 | -24.117 | -13.915 | -0.217 | -23.647 | 76.970 | -11.837 |
| 50.0000 | -22.614 | -22.614 | -12.045 | -0.334 | -22.144 | 73.886 | -14.737 |
| 60.0000 | -21.581 | -21.581 | -10.534 | -0.473 | -21.111 | 70.890 | -17.619 |
| 70.0000 | -20.925 | -20.925 | -9.266 | -0.632 | -20.454 | 67.974 | -20.500 |
| 80.0000 | -20.608 | -20.608 | -8.170 | -0.813 | -20.137 | 65.120 | -23.403 |
| 90.0000 | -20.633 | -20.633 | -7.201 | -1.017 | -20.161 | 62.297 | -26.359 |
| 100.000 | -21.048 | -21.048 | -6.324 | -1.248 | -20.576 | 59.460 | -29.407 |
| 105.000 | -21.434 | -21.434 | -5.913 | -1.376 | -20.961 | 58.020 | -30.979 |
| 110.000 | -21.969 | -21.969 | -5.517 | -1.513 | -21.496 | 56.553 | -32.588 |
| 115.000 | -22.690 | -22.690 | -5.134 | -1.662 | -22.217 | 55.052 | -34.242 |
| 120.000 | -23.655 | -23.655 | -4.765 | -1.824 | -23.181 | 53.506 | -35.944 |
| 122.000 | -24.128 | -24.128 | -4.620 | -1.893 | -23.655 | 52.873 | -36.639 |
| 124.000 | -24.563 | -24.663 | -4.477 | -1.965 | -24.190 | 52.231 | -37.343 |
| 126.000 | -25.272 | -25.272 | -4.336 | -2.039 | -24.798 | 51.578 | -38.055 |
| 128.000 | -25.967 | -25.967 | -4.197 | -2.117 | -25.494 | 50.915 | -38.777 |
| 130.000 | -26.769 | -26.769 | -4.060 | -2.198 | -26.297 | 50.240 | -39.507 |
| 132.000 | -27.704 | -27.704 | -3.924 | -2.282 | -27.232 | 49.553 | -40.246 |
| 134.000 | -28.810 | -28.810 | -3.791 | -2.370 | -28.340 | 48.853 | -40.994 |
| 136.000 | -30.143 | -30.143 | -3.659 | -2.462 | -29.675 | 48.140 | -41.751 |
| 138.000 | -31.790 | -31.789 | -3.529 | -2.558 | -31.328 | 47.412 | -42.517 |
| 140.000 | -33.894 | -33.894 | -3.401 | -2.658 | -33.447 | 46.670 | -43.290 |
| 142.000 | -36.701 | -36.701 | -3.276 | -2.764 | -36.291 | 45.913 | -44.071 |
| 144.000 | -40.454 | -40.455 | -3.153 | -2.874 | -40.175 | 45.140 | -44.860 |
| 146.000 | -43.250 | -43.249 | -3.031 | -2.990 | -43.249 | 44.351 | -45.654 |
| 148.000 | -40.149 | -40.149 | -2.913 | -3.112 | -39.949 | 43.545 | -46.454 |
| 150.000 | -36.028 | -36.028 | -2.797 | -3.239 | -35.680 | 42.723 | -47.259 |
| 152.000 | -32.857 | -32.857 | -2.684 | -3.374 | -32.454 | 41.883 | -48.066 |
| 154.000 | -30.390 | -30.390 | -2.573 | -3.515 | -29.963 | 41.026 | -48.875 |
| 156.000 | -28.385 | -28.385 | -2.466 | -3.663 | -27.945 | 40.151 | -49.684 |
| 158.000 | -26.697 | -26.697 | -2.362 | -3.819 | -26.250 | 39.259 | -50.491 |
| 160.000 | -25.239 | -25.239 | -2.262 | -3.984 | -24.786 | 38.350 | -51.292 |
| 162.000 | -23.954 | -23.954 | -2.165 | -4.156 | -23.498 | 37.423 | -52.087 |
| 164.000 | -22.804 | -22.804 | -2.072 | -4.338 | -22.346 | 36.480 | -52.871 |
| 166.000 | -21.765 | -21.765 | -1.982 | -4.529 | -21.304 | 35.521 | -53.641 |
| 168.000 | -20.815 | -20.815 | -1.898 | -4.730 | -20.353 | 34.546 | -54.393 |
| 170.000 | -19.942 | -19.942 | -1.817 | -4.942 | -19.479 | 33.557 | -55.123 |
| 175.000 | -18.028 | -18.028 | -1.636 | -5.518 | -17.563 | 31.026 | -56.819 |
| 180.000 | -16.415 | -16.415 | -1.487 | -6.166 | -15.948 | 28.429 | -58.252 |
| 185.000 | -15.033 | -15.033 | -1.372 | -6.892 | -14.565 | 25.790 | -59.306 |
| 190.000 | -13.841 | -13.841 | -1.292 | -7.695 | -13.372 | 23.137 | -59.834 |
| 195.000 | -12.808 | -12.808 | -1.248 | -8.571 | -12.338 | 20.501 | -59.655 |
| 200.000 | -11.912 | -11.912 | -1.239 | -9.507 | -11.441 | 17.914 | -58.555 |

*Figure 4*

| FREQ-MHZ | DB[S11] | DB[S22] | DB[S21] | DB[S31] | DB[S23] | ANG[S21] | ANG[S31] |
|---|---|---|---|---|---|---|---|
| 100.000 | -37.954 | -37.954 | -28.522 | -0.007 | -37.911 | 87.616 | -2.153 |
| 200.000 | -32.006 | -32.006 | -22.517 | -0.030 | -31.963 | 85.214 | -4.299 |
| 300.000 | -28.606 | -28.606 | -19.021 | -0.067 | -28.563 | 82.852 | -6.437 |
| 400.000 | -26.279 | -26.279 | -16.556 | -0.118 | -26.236 | 80.512 | -8.563 |
| 500.000 | -24.564 | -24.564 | -14.659 | -0.183 | -24.521 | 78.214 | -10.674 |
| 600.000 | -23.256 | -23.257 | -13.122 | -0.260 | -23.214 | 75.960 | -12.771 |
| 700.000 | -22.250 | -22.250 | -11.835 | -0.350 | -22.208 | 73.752 | -14.854 |
| 800.000 | -21.484 | -21.484 | -10.728 | -0.452 | -21.441 | 71.591 | -16.929 |
| 900.000 | -20.922 | -20.922 | -9.759 | -0.565 | -20.879 | 69.471 | -19.000 |
| 1000.00 | -20.544 | -20.544 | -8.895 | -0.689 | -20.501 | 67.392 | -21.076 |
| 1050.00 | -20.420 | -20.420 | -8.495 | -0.755 | -20.378 | 66.366 | -22.119 |
| 1100.00 | -20.341 | -20.341 | -8.114 | -0.825 | -20.298 | 65.343 | -23.167 |
| 1150.00 | -20.306 | -20.307 | -7.749 | -0.897 | -20.264 | 64.326 | -24.223 |
| 1200.00 | -20.317 | -20.317 | -7.400 | -0.973 | -20.275 | 63.311 | -25.286 |
| 1250.00 | -20.377 | -20.377 | -7.063 | -1.052 | -20.335 | 62.295 | -26.361 |
| 1300.00 | -20.488 | -20.488 | -6.739 | -1.134 | -20.445 | 61.278 | -27.448 |
| 1350.00 | -20.654 | -20.654 | -6.425 | -1.221 | -20.612 | 60.255 | -28.549 |
| 1400.00 | -20.881 | -20.881 | -6.120 | -1.312 | -20.839 | 59.227 | -29.667 |
| 1450.00 | -21.178 | -21.178 | -5.825 | -1.408 | -21.135 | 58.187 | -30.803 |
| 1500.00 | -21.553 | -21.553 | -5.538 | -1.509 | -21.510 | 57.135 | -31.960 |
| 1550.00 | -22.021 | -22.020 | -5.258 | -1.615 | -21.978 | 56.064 | -33.139 |
| 1600.00 | -22.599 | -22.599 | -4.984 | -1.729 | -22.557 | 54.972 | -34.343 |
| 1650.00 | -23.314 | -23.314 | -4.718 | -1.850 | -23.273 | 53.855 | -35.573 |
| 1700.00 | -24.202 | -24.202 | -4.457 | -1.979 | -24.160 | 52.712 | -36.830 |
| 1720.00 | -24.620 | -24.620 | -4.355 | -2.033 | -24.578 | 52.244 | -37.341 |
| 1740.00 | -25.077 | -25.078 | -4.253 | -2.089 | -25.036 | 51.772 | -37.857 |
| 1760.00 | -25.584 | -25.584 | -4.152 | -2.146 | -25.542 | 51.294 | -38.378 |
| 1780.00 | -26.143 | -26.144 | -4.053 | -2.205 | -26.103 | 50.810 | -38.903 |
| 1800.00 | -26.770 | -26.770 | -3.954 | -2.266 | -26.729 | 50.320 | -39.433 |
| 1820.00 | -27.473 | -27.473 | -3.856 | -2.329 | -27.433 | 49.823 | -39.967 |
| 1840.00 | -28.270 | -28.270 | -3.760 | -2.394 | -28.229 | 49.319 | -40.507 |
| 1860.00 | -29.184 | -29.184 | -3.664 | -2.461 | -29.144 | 48.809 | -41.051 |
| 1880.00 | -30.243 | -30.243 | -3.569 | -2.530 | -30.204 | 48.291 | -41.599 |
| 1900.00 | -31.503 | -31.503 | -3.476 | -2.601 | -31.464 | 47.765 | -42.152 |
| 1920.00 | -33.028 | -33.028 | -3.383 | -2.675 | -32.990 | 47.233 | -42.710 |
| 1940.00 | -34.960 | -34.961 | -3.292 | -2.751 | -34.924 | 46.692 | -43.272 |
| 1960.00 | -37.531 | -37.531 | -3.202 | -2.830 | -37.496 | 46.143 | -43.837 |
| 1980.00 | -41.351 | -41.352 | -3.112 | -2.912 | -41.324 | 45.586 | -44.405 |
| 2000.00 | -48.656 | -48.662 | -3.025 | -2.996 | -48.647 | 45.020 | -44.979 |
| 2020.00 | -56.268 | -56.275 | -2.938 | -3.084 | -56.145 | 44.446 | -45.554 |
| 2040.00 | -43.561 | -43.559 | -2.853 | -3.175 | -43.497 | 43.862 | -46.133 |
| 2060.00 | -38.445 | -38.444 | -2.769 | -3.269 | -38.390 | 43.270 | -46.713 |
| 2080.00 | -35.164 | -35.164 | -2.686 | -3.366 | -35.114 | 42.669 | -47.296 |
| 2100.00 | -32.732 | -32.732 | -2.605 | -3.467 | -32.683 | 42.059 | -47.879 |
| 2120.00 | -30.788 | -30.788 | -2.526 | -3.572 | -30.741 | 41.440 | -48.464 |
| 2140.00 | -29.164 | -29.163 | -2.448 | -3.681 | -29.116 | 40.811 | -49.048 |
| 2160.00 | -27.765 | -27.765 | -2.372 | -3.793 | -27.718 | 40.173 | -49.631 |
| 2180.00 | -26.534 | -26.535 | -2.298 | -3.910 | -26.488 | 39.526 | -50.213 |
| 2200.00 | -25.434 | -25.435 | -2.225 | -4.032 | -25.389 | 38.870 | -50.791 |

*Figure 5A*

| FREQ-MHZ | DB[S11] | DB[S22] | DB[S21] | DB[S31] | DB[S23] | ANG[S21] | ANG[S31] |
|---|---|---|---|---|---|---|---|
| 2220.00 | -24.439 | -24.439 | -2.155 | -4.158 | -24.393 | 38.205 | -51.366 |
| 2240.00 | -23.529 | -23.529 | -2.086 | -4.289 | -23.483 | 37.532 | -51.937 |
| 2260.00 | -22.689 | -22.689 | -2.020 | -4.424 | -22.644 | 36.848 | -52.500 |
| 2280.00 | -21.911 | -21.911 | -1.955 | -4.565 | -21.866 | 36.158 | -53.057 |
| 2300.00 | -21.185 | -21.185 | -1.893 | -4.711 | -21.140 | 35.458 | -53.605 |
| 2350.00 | -19.559 | -19.559 | -1.747 | -5.100 | -19.515 | 33.676 | -54.922 |
| 2400.00 | -18.149 | -18.149 | -1.617 | -5.526 | -18.105 | 31.850 | -56.143 |
| 2450.00 | -16.908 | -16.908 | -1.504 | -5.991 | -16.864 | 29.987 | -57.231 |
| 2500.00 | -15.805 | -15.805 | -1.408 | -6.496 | -15.761 | 28.096 | -58.143 |
| 2550.00 | -14.819 | -14.819 | -1.330 | -7.044 | -14.775 | 26.187 | -58.828 |
| 2600.00 | -13.933 | -13.933 | -1.271 | -7.634 | -13.889 | 24.272 | -59.223 |
| 2650.00 | -13.136 | -13.136 | -1.231 | -8.265 | -13.092 | 22.364 | -59.259 |
| 2700.00 | -12.417 | -12.417 | -1.209 | -8.934 | -12.373 | 20.471 | -58.856 |
| 2750.00 | -11.769 | -11.769 | -1.207 | -9.634 | -11.725 | 18.610 | -57.918 |
| 2800.00 | -11.186 | -11.186 | -1.221 | -10.354 | -11.142 | 16.792 | -56.351 |
| 2850.00 | -10.659 | -10.659 | -1.254 | -11.076 | -10.615 | 15.024 | -54.055 |
| 2900.00 | -10.187 | -10.187 | -1.302 | -11.777 | -10.143 | 13.320 | -50.960 |
| 2950.00 | -9.762 | -9.762 | -1.364 | -12.425 | -9.718 | 11.688 | -47.022 |
| 3000.00 | -9.381 | -9.381 | -1.440 | -12.981 | -9.337 | 10.135 | -42.296 |

Figure 5B

| FREQ-MHZ | DB[S11] | DB[S22] | DB[S21] | DB[S31] | DB[S23] | ANG[S21] | ANG[S31] |
|---|---|---|---|---|---|---|---|
| 10.0000 | -6.021 | -6.021 | -6.021 | -6.017 | -6.023 | -0.639 | -3.144 |
| 20.0000 | -6.023 | -6.023 | -6.023 | -6.006 | -6.031 | -1.274 | -6.287 |
| 30.0000 | -6.026 | -6.026 | -6.025 | -5.988 | -6.044 | -1.904 | -9.427 |
| 40.0000 | -6.030 | -6.030 | -6.028 | -5.963 | -6.062 | -2.526 | -12.562 |
| 50.0000 | -6.036 | -6.036 | -6.031 | -5.931 | -6.086 | -3.136 | -15.691 |
| 60.0000 | -6.044 | -6.044 | -6.035 | -5.892 | -6.114 | -3.732 | -18.814 |
| 70.0000 | -6.054 | -6.054 | -6.038 | -5.847 | -6.149 | -4.313 | -21.928 |
| 80.0000 | -6.068 | -6.068 | -6.041 | -5.795 | -6.189 | -4.876 | -25.032 |
| 90.0000 | -6.084 | -6.084 | -6.042 | -5.736 | -6.235 | -5.420 | -28.127 |
| 100.000 | -6.105 | -6.105 | -6.041 | -5.672 | -6.287 | -5.942 | -31.212 |
| 120.000 | -6.163 | -6.163 | -6.033 | -5.526 | -6.410 | -6.922 | -37.349 |
| 140.000 | -6.246 | -6.246 | -6.009 | -5.358 | -6.561 | -7.816 | -43.444 |
| 160.000 | -6.362 | -6.362 | -5.962 | -5.173 | -6.744 | -8.636 | -49.501 |
| 180.000 | -6.522 | -6.522 | -5.888 | -4.972 | -6.963 | -9.409 | -55.526 |
| 200.000 | -6.734 | -6.734 | -5.779 | -4.760 | -7.227 | -10.176 | -61.529 |
| 220.000 | -7.013 | -7.013 | -5.630 | -4.541 | -7.544 | -10.996 | -67.520 |
| 240.000 | -7.373 | -7.373 | -5.439 | -4.319 | -7.927 | -11.943 | -73.510 |
| 260.000 | -7.834 | -7.834 | -5.207 | -4.100 | -8.392 | -13.099 | -79.505 |
| 280.000 | -8.419 | -8.419 | -4.938 | -3.890 | -8.960 | -14.554 | -85.510 |
| 300.000 | -9.156 | -9.156 | -4.642 | -3.695 | -9.661 | -16.385 | -91.520 |
| 320.000 | -10.085 | -10.085 | -4.330 | -3.521 | -10.533 | -18.656 | -97.521 |
| 340.000 | -11.257 | -11.257 | -4.019 | -3.372 | -11.630 | -21.407 | -103.490 |
| 360.000 | -12.748 | -12.748 | -3.723 | -3.253 | -13.033 | -24.645 | -109.393 |
| 365.000 | -13.184 | -13.184 | -3.654 | -3.227 | -13.446 | -25.529 | -110.854 |
| 370.000 | -13.650 | -13.650 | -3.587 | -3.204 | -13.887 | -26.442 | -112.308 |
| 375.000 | -14.149 | -14.149 | -3.522 | -3.183 | -14.362 | -27.383 | -113.754 |
| 380.000 | -14.685 | -14.685 | -3.461 | -3.163 | -14.873 | -28.352 | -115.192 |
| 385.000 | -15.262 | -15.262 | -3.402 | -3.146 | -15.426 | -29.347 | -116.621 |
| 390.000 | -15.886 | -15.886 | -3.346 | -3.130 | -16.027 | -30.367 | -118.040 |
| 395.000 | -16.564 | -16.564 | -3.293 | -3.116 | -16.681 | -31.413 | -119.450 |
| 400.000 | -17.304 | -17.304 | -3.244 | -3.103 | -17.398 | -32.481 | -120.849 |
| 401.000 | -17.460 | -17.460 | -3.235 | -3.101 | -17.550 | -32.698 | -121.127 |
| 402.000 | -17.620 | -17.620 | -3.226 | -3.099 | -17.705 | -32.915 | -121.405 |
| 403.000 | -17.782 | -17.782 | -3.217 | -3.097 | -17.863 | -33.134 | 121.683 |
| 404.000 | -17.948 | -17.948 | -3.208 | -3.094 | -18.024 | -33.353 | -121.960 |
| 405.000 | -18.117 | -18.117 | -3.199 | -3.092 | -18.189 | -33.573 | -122.237 |
| 406.000 | -18.290 | -18.290 | -3.190 | -3.090 | -18.357 | -33.794 | -122.513 |
| 407.000 | -18.466 | -18.466 | -3.182 | -3.088 | -18.530 | -34.016 | -122.789 |
| 408.000 | -18.646 | -18.646 | -3.173 | -3.086 | -18.705 | -34.238 | -123.064 |
| 409.000 | -18.830 | -18.831 | -3.165 | -3.085 | -18.885 | -34.462 | -123.339 |
| 410.000 | -19.019 | -19.019 | -3.157 | -3.083 | -19.069 | -34.686 | -123.614 |
| 411.000 | -19.211 | -19.211 | -3.149 | -3.081 | -19.258 | -34.911 | -123.888 |
| 412.000 | -19.408 | -19.408 | -3.142 | -3.079 | -19.451 | -35.137 | -124.161 |
| 413.000 | -19.609 | -19.609 | -3.134 | -3.078 | -19.648 | -35.364 | -124.434 |
| 414.000 | -19.816 | -19.816 | -3.127 | -3.076 | -19.851 | -35.591 | -124.707 |

*Figure 6A*

| FREQ-MHZ | DB[S11] | DB[S22] | DB[S21] | DB[S31] | DB[S23] | ANG[S21] | ANG[S31] |
|---|---|---|---|---|---|---|---|
| 415.000 | -20.028 | -20.028 | -3.120 | -3.075 | -20.058 | -35.819 | -124.979 |
| 416.000 | -20.245 | -20.244 | -3.113 | -3.073 | -20.272 | -36.048 | -125.250 |
| 417.000 | -20.467 | -20.467 | -3.106 | -3.072 | -20.490 | -36.278 | -125.522 |
| 418.000 | -20.696 | -20.696 | -3.099 | -3.071 | -20.715 | -36.509 | -125.792 |
| 419.000 | -20.930 | -20.930 | -3.092 | -3.069 | -20.946 | -36.740 | -126.063 |
| 420.000 | -21.172 | -21.172 | -3.086 | -3.068 | -21.184 | -36.972 | -126.332 |
| 421.000 | -21.420 | -21.420 | -3.080 | -3.067 | -21.429 | -37.204 | -126.602 |
| 422.000 | -21.675 | -21.675 | -3.074 | -3.066 | -21.681 | -37.438 | -126.870 |
| 423.000 | -21.939 | -21.939 | -3.068 | -3.065 | -21.941 | -37.672 | -127.139 |
| 424.000 | -22.210 | -22.210 | -3.062 | -3.063 | -22.210 | -37.907 | -127.407 |
| 425.000 | -22.491 | -22.491 | -3.057 | -3.062 | -22.487 | -38.142 | -127.674 |
| 426.000 | -22.781 | -22.781 | -3.051 | -3.061 | -22.774 | -38.379 | -127.941 |
| 427.000 | -23.080 | -23.080 | -3.046 | -3.060 | -23.070 | -38.615 | -128.207 |
| 428.000 | -23.391 | -23.391 | -3.041 | -3.060 | -23.378 | -38.853 | -128.473 |
| 429.000 | -23.713 | -23.713 | -3.036 | -3.059 | -23.697 | -39.091 | -128.739 |
| 430.000 | -24.047 | -24.047 | -3.032 | -3.058 | -24.029 | -39.330 | -129.004 |
| 431.000 | -24.395 | -24.395 | -3.027 | -3.057 | -24.374 | -39.569 | -129.268 |
| 432.000 | -24.757 | -24.757 | -3.023 | -3.056 | -24.733 | -39.809 | -129.532 |
| 433.000 | -25.135 | -25.135 | -3.019 | -3.056 | -25.109 | -40.060 | -129.796 |
| 434.000 | -25.530 | -25.529 | -3.015 | -3.055 | -25.501 | -40.291 | -130.059 |
| 435.000 | -25.943 | -25.943 | -3.011 | -3.054 | -25.913 | -40.533 | -130.322 |
| 436.000 | -26.377 | -26.377 | -3.007 | -3.054 | -26.345 | -40.775 | -130.584 |
| 437.000 | -26.833 | -26.834 | -3.004 | -3.053 | -26.799 | -41.019 | -130.846 |
| 438.000 | -27.316 | -27.315 | -3.000 | -3.053 | -27.279 | -41.262 | -131.107 |
| 439.000 | -27.825 | -27.825 | -2.997 | -3.052 | -27.788 | -41.506 | -131.368 |
| 440.000 | -28.367 | -28.367 | -2.994 | -3.052 | -28.328 | -41.751 | -131.628 |
| 441.000 | -28.944 | -28.944 | -2.992 | -3.051 | -28.903 | -41.996 | -131.888 |
| 442.000 | -29.562 | -29.561 | -2.989 | -3.051 | -29.520 | -42.242 | -132.147 |
| 443.000 | -30.226 | -30.226 | -2.987 | -3.051 | -30.184 | -42.486 | -132.407 |
| 444.000 | -30.945 | -30.945 | -2.985 | -3.050 | -30.902 | -42.735 | -132.665 |
| 445.000 | -31.728 | -31.727 | -2.983 | -3.050 | -31.685 | -42.982 | -132.923 |
| 446.000 | -32.587 | -32.588 | -2.981 | -3.050 | -32.543 | -43.230 | -133.181 |
| 447.000 | -33.539 | -33.539 | -2.979 | -3.049 | -33.496 | -43.478 | -133.438 |
| 448.000 | -34.606 | -34.607 | -2.978 | -3.049 | -34.564 | -43.727 | -133.695 |
| 449.000 | -35.820 | -35.819 | -2.977 | -3.049 | -35.779 | -43.976 | -133.951 |
| 450.000 | -37.223 | -37.222 | -2.976 | -3.049 | -37.185 | -44.225 | -134.207 |
| 451.000 | -38.884 | -38.884 | -2.975 | -3.049 | -38.851 | -44.475 | -134.462 |
| 452.000 | -40.911 | -40.912 | -2.974 | -3.048 | -40.886 | -44.726 | -134.717 |
| 453.000 | -43.483 | -43.484 | -2.973 | -3.048 | -43.472 | -44.977 | -134.972 |
| 454.000 | -46.857 | -46.857 | -2.973 | -3.048 | -46.880 | -45.228 | -135.226 |
| 455.000 | -50.773 | -50.772 | -2.973 | -3.048 | -50.845 | -45.480 | -135.480 |
| 456.000 | -50.920 | -50.923 | -2.973 | -3.048 | -50.927 | -45.732 | -135.733 |
| 457.000 | -47.042 | -47.045 | -2.973 | -3.048 | -46.981 | -45.985 | -135.986 |
| 458.000 | -43.629 | -43.630 | -2.974 | -3.048 | -43.555 | -46.238 | -136.238 |
| 459.000 | -41.029 | -41.029 | -2.974 | -3.048 | -40.955 | -46.491 | -136.491 |
| 460.000 | -38.985 | -38.985 | -2.975 | -3.048 | -38.913 | -46.744 | -136.742 |
| 465.000 | -32.663 | -32.664 | -2.982 | -3.048 | -32.602 | -48.018 | -137.995 |
| 470.000 | -29.023 | -29.022 | -2.994 | -3.049 | -28.973 | -49.299 | -139.239 |
| 475.000 | -26.464 | -26.464 | -3.011 | -3.050 | -26.429 | -50.587 | -140.474 |
| 480.000 | -24.492 | -24.492 | -3.032 | -3.051 | -24.475 | -51.881 | -141.701 |
| 485.000 | -22.886 | -22.886 | -3.058 | -3.052 | -22.892 | -53.179 | -141.922 |
| 490.000 | -21.531 | -21.531 | -3.090 | -3.053 | -21.564 | -54.481 | -144.136 |
| 495.000 | -20.360 | -20.360 | -3.126 | -3.055 | -20.424 | -55.786 | -145.345 |
| 500.000 | -19.327 | -19.327 | -3.167 | -3.057 | -19.428 | -57.092 | -146.549 |
| 510.000 | -17.566 | -17.566 | -3.265 | -3.061 | -17.755 | -59.705 | -148.946 |

*Figure 6B*

| FREQ-MHZ | DB[S11] | DB[S22] | DB[S21] | DB[S31] | DB[S23] | ANG[S21] | ANG[S31] |
|---|---|---|---|---|---|---|---|
| 520.000 | -16.096 | -16.096 | -3.383 | -3.066 | -16.393 | -62.311 | -151.334 |
| 530.000 | -14.831 | -14.831 | -3.521 | -3.073 | -15.257 | -64.903 | -153.718 |
| 540.000 | -13.718 | -13.718 | -3.680 | -3.083 | -14.292 | -67.470 | -156.102 |
| 550.000 | -12.723 | -12.723 | -3.859 | -3.095 | -13.464 | -70.004 | -158.491 |
| 560.000 | -11.822 | -11.822 | -4.059 | -3.112 | -12.749 | -72.495 | -160.884 |
| 570.000 | -10.999 | -10.999 | -4.279 | -3.134 | -12.127 | -74.932 | -163.284 |
| 580.000 | -10.243 | -10.243 | -4.520 | -3.162 | -11.587 | -77.305 | -165.689 |
| 590.000 | -9.545 | -9.545 | -4.779 | -3.197 | -11.117 | -79.603 | -168.096 |
| 600.000 | -8.898 | -8.898 | -5.058 | -3.241 | -10.710 | -81.814 | -170.502 |
| 625.000 | -7.479 | -7.479 | -5.832 | -3.387 | -9.923 | -86.889 | -176.477 |
| 650.000 | -6.301 | -6.301 | -6.700 | -3.593 | -9.406 | -91.188 | -177.679 |
| 675.000 | -5.327 | -5.327 | -7.636 | -3.858 | -9.100 | -94.578 | -172.061 |
| 700.000 | -4.527 | -4.527 | -8.608 | -4.173 | -8.958 | -96.978 | -166.749 |
| 725.000 | -3.873 | -3.873 | -9.582 | -4.531 | -8.941 | -98.365 | -161.797 |
| 750.000 | -3.337 | -3.337 | -10.522 | -4.919 | -9.018 | -98.787 | -157.230 |

Figure 6C

NINETY DEGREE COUPLER FOR RADIO FREQUENCY DEGRADED CIRCUITS

FIELD OF INVENTION

The present invention relates to ninety degree couplers suited for use in integrated circuits operating between 100 mHz to GHz ranges.

BACKGROUND OF THE INVENTION

Ninety degree couplers are used in many radio frequency integrated circuit (RFIC) applications. Couplers split or combine two orthogonal signals. This kind of coupler is used in balanced amplifiers, mixers, particularly Gilbert cell mixers, balanced attenuators, signal splitters and signal combiners. Particularly popular use for ninety degree couplers is in cell phones. Cell phone signals are multiplexed into In-phase, I and Quadrature panels. Ninety degree couplers are used to bind the signals for transmission and separate them for reception. Currently, the predominant form on ninety degree coupler for RFIC applications is an RC network. Couplers have been provided in MMIC technology and GaAs processing. However, greater simplicity can yet be achieved. It is desirable to minimize the number of components in a ninety degree coupler. This allows a smaller IC area. Reducing area permits reduce costs and insensitivity to spurious signals.

SUMMARY OF THE INVENTION

In accordance with the present invention, a ninety degree coupler is provided for a frequency range of 100 mHz to 2500 mHz and beyond to accommodate new frequency bands and including a minimum number of components.

Briefly stated, in accordance with the present invention, there is provided a four port device which receives an input at port 1. The signal is split between a transformer coil and another reactor. In one form, the signal entering port 1 splits between the transformer and a capacitor. Part of the signal is coupled to port 2 through the transformer by mutual inductance. Another part of the signal couples through cross-connected capacitors. Phase shift created by the inductors and capacitors result in signals adding at ports 2 and 3 and signal cancellation at point 4. Phase of the signal shift from port 1 to port 2 is 45 degrees and from port 3 is −45 degrees. Thus the phase shift between the signal and ports 2 and 3 is 90 degrees and remains 90 degrees over a wide frequency band. In another embodiment, a signal passes around from port 1 to port 2 to port 3 to port 4 with a ninety degree phase delay at each port. The power from port 1 will be equally split between port 2 and port 3 and the phase of the signal will be 90 degrees and 180 degrees respectively, providing a 90 degree phase shift across ports 2 and 3.

BRIEF DESCRIPTION OF THE DRAWINGS

The means by which the invention is embodied may be further understood with reference to the following description taken in connection with the following drawings.

Of the drawings:

FIG. 4, FIG. 5, comprising FIGS. 5A and 5B, and FIG. 6, comprising FIGS. 6A, 6B and 6C are charts illustrating performance of the embodiments of FIGS. 1 and 2.

DETAILED DESCRIPTION OF THE INVENTION

The prior art IC couplers utilize lumped components wherein it is desirable to provide a coupler which takes less surface area on the IC chip.

The present invention provides advantages both in performance and in manufacturability. Closely coupled bifilar transformers are utilized. This form of transformer, more specifically illustrated in FIG. 3 below takes reduced space on an IC chip compared to prior art arrangements.

Figure 1:
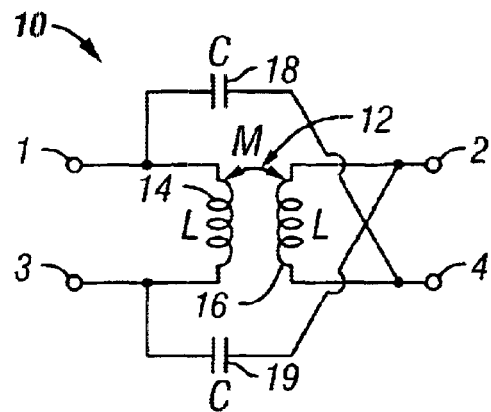
FIG. 1 is a schematic of a first embodiment of the present invention.

Referring now to FIG. 1, there is illustrated in schematic form a 90 degree coupler 10 constructed in accordance with the present invention. The 90 degree coupler 10 comprises a transformer 12 having a primary winding 14 and a secondary winding 16. The windings 14 and 16 are coupled in-phase. The winding 14 is connected across ports 1 and 3. The winding 16 is connected across ports 2 and 4.

First and second capacitors 18 and 19 are cross-coupled across the transformer 12. More specifically, a capacitor 18 is connected from point 1 to point 4, and a capacitor 19 is connected from port 3 to port 2. Each of the capacitors 18 and 19 are connected from one respective end of the primary winding 14 to respectively opposite ends of the secondary winding 16.

In operation, a signal entering port 1 splits between the transformer winding 14 and the capacitor 18. The mutual inductance of the transformer 12 couples part of the signal across the winding 14 to the secondary winding 16. At the signal is coupled to port 4 from port 1 through the primary coil 14 of the transformer 12. Another part of the signal applied to port 1 is coupled through the cross-connected capacitors 18 and 19. Due to the phase shifts created by inductors 14 and 16 and capacitors 18 and 19, signals at port 2 receive from the signal applied to port 1 and to each other. Similarly, signal adding occurs at port 3. Due to the relative polarities, there is signal cancellation at port 4.

The phase shift from port one to port 2 is 45 degrees. The phase shift from port 1 to port 3 is −45 degrees. Consequently, the phase shift between signals at ports 2 and 3 is ninety degrees. Phase shift remains very very close to 90 degrees in a wide frequency band.

It is important to translate signals via the transformer 12. The transformer 12 should have very high coupling between the primary coil 14 and the secondary coil 16. More specifically, mutual inductance, M should be equal to the winding inductance, L, or almost L. It is important to use very tightly coupled inductors. The inductors may be preferably bifilar or multilayer balanced. Two capacitors used with the transformers form a narrow band equivalent to a quarter-wave directional coupler. As an example, in an embodiment for frequency f=100 mHz, component values were used L=40 nH and C=15.5 pF.

For frequency f=2 GHz, component values in a particular embodiment are L=1.5 nH and c=0.8 pF.

Figure 2:
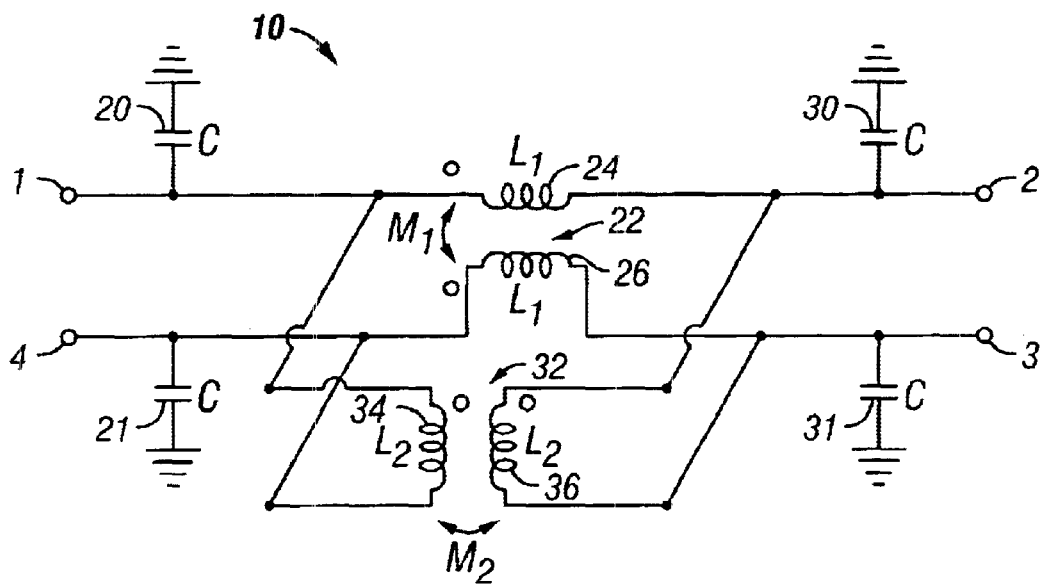
FIG. 2 is a schematic drawing of the second embodiment of the present invention.
Figure 3:
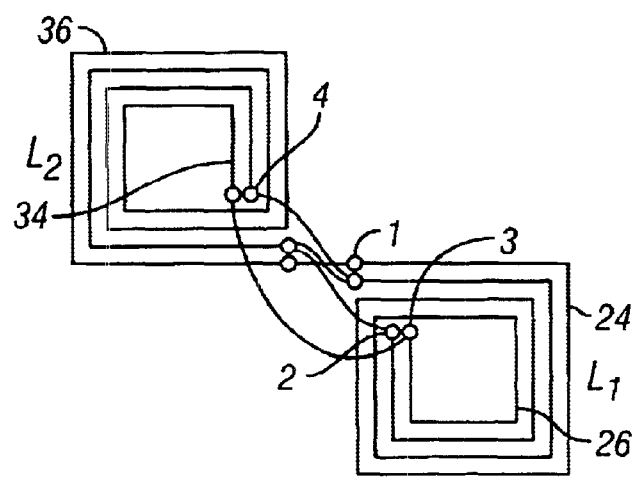
FIG. 3 is a mechanical diagram of the layout of the transformers of FIG. 2.

FIG. 2 illustrates another embodiment of the 90 degree coupler 10 having ports 1, 2, 3 and 4. FIG. 3 is a plan view of a physical embodiment of the circuit of FIG. 2. Capacitors 20 and 21 are connected between ports 1 and 4 respectively and ground. Similarly, capacitors 30 and 31 are respectively connected across ports 2 and 3a and ground. The capacitors 20, 21 30 and 31 are transmission line capacitors. Note that in this embodiment, ports 1 and 4 are illustrated at the left of the diagram, and ports 2 and 3 are illustrated at the right of the diagram. This embodiment comprises a first transformer 22 having a primary winding 24 connected between the ports 1 and 2 and a secondary winding 26 connected between the ports 4 and 3. The windings are closely coupled to have a mutual inductance M1. Each winding has an inductance value L1. The windings 24 and 26 are coupled in-phase.

Similarly, a second transformer 32 is provided with a primary winding 34 and a secondary winding 36 coupled in-phase. The windings 34 and 36 have mutual inductance M2 and each have an inductance value of L2. The winding 34 is connected across ports 1 and 4. The winding 36 is connected across ports 2 and 3.

A signal entering port 1 is divided between two paths. The first path is through the winding 24 of the port 2 and the second path is through the winding 34 to the port 4. A signal from port 2 passes through the winding 36 to port 3 and from port 3 through the winding 26 to port 4. The shunt capacitors 20, 21, 30 and 31 act in conjunction with transformer windings 24, 26, 34 and 36 to form transmission lines.

In order to balance this circuit, each path between ports will have to shift the phase of the signal 90 degrees. This means that the signal passing from port 1 will be delayed in-phase 90 degrees at port 2 180 degrees at port 3 270 degrees at port 4. Signals passing in the other direction from port 4 to point 1 will be shifted in-phase 90 degrees and will be cancelled with the signal passing around from port 1 to port 2 to port 3 to port 4. Consequently no power will be available at port 4.

Power from port 1 will be equally split between port 2 and port 3 and the phase of this signal will be 90 degrees and 180 degrees respectively. Any reflections from the terminations of port 2 and/or port 3 will be transferred to port 4. In this case, power will appear at port 4 and be dissipated in determination of port 4.

The topology of this coupler has a low-pass filter response. Consequently, further filtering which removes higher frequency components of signals is provided. The close coupling between windings 24 and 26 of transformer 22 and between the windings 34 and 36 of the transformer 32 permits the compact physical arrangement seen in FIG. 3.

FIGS. 4–6 illustrate the relations of the embodiments of FIGS. 1 and 2, and the performance in each simulation, following parameters are measured:

$s_{11}$, input reflection co-efficient with the output port terminated by a matched load, $s_{22}$ output reflection co-efficient with the input terminated by a matched load;

$s_{21}$ forward transmission(s) insertion gain with the output port terminated in a matched load;

$s_{31}$ a forward transmission co-efficient;

$s_{23}$ forward transmission co-efficient.

ang-$s_{21}$ and ang-$s_{23}$ are measured in degrees.

These are the phased differences between terminal 2 and terminal 1 and the phase differences between port 3 and port 1 respectively and measured in degrees. Forty-five degrees is ideal since it is half of 90 degrees.

EXAMPLE I

Signal C coupler equivalent to a quarter-wave direction is provided in an embodiment designed to operate in the are of f=100 mHz with L=40 nH and c=15.5 pF and tested over a range of 10 mHz to 200 mHz results are represented in FIG. 4.

EXAMPLE II

A coupler intended to operate at the higher range, for example 2 GHz has component values of L=1.98 nH and c=0.8 pF and is tested over each of 100 mHz to 3 GHz.

EXAMPLE III

A hybrid branch coupler with mutually coupled conductors was simulated according to the embodiment of FIG. 2 with the values L1=9 nH, L2=18 nH, C=7 pF, M1=0.95 (L) and M2=0.95(L). In this embodiment, for angle $s_{21}$ and angle $s_{23}$ there is ideally a difference of 90 degrees between them. As stated in the text of Example III this is over range of one frequency to another 10 mHz through 750 mHz.

The present invention makes effective use of tightly coupled conductors connected between ports. The present disclosure will enable those skilled in the art to provide many different constructions apart from the specific illustrations of the present examples in accordance with the present invention.

What is claimed is:

1. A ninety degree coupler comprising: a four port device, a first transformer winding connected across a first pair of ports, a second transformer winding being coupled across a second pair of ports, said windings being tightly coupled in-phase, and first and second capacitors each connected from one end of a primary winding to an opposite end of the secondary winding.

2. The coupler according to claim 1 wherein said windings are provided with a mutual inductance of M≧L, where L is the inductance value of a winding.

3. The coupler according to claim 2 each of said capacitors has a value of c and wherein the values of L and C are selected to provide a phase difference between the second pair of ports of substantially ninety degrees.

4. The coupler according to claim 3 wherein values of L and C are selected to provide the phase difference over a pre-selected range of input frequencies.

* * * * *